(12) United States Patent
Cho et al.

(10) Patent No.: US 7,375,564 B2
(45) Date of Patent: May 20, 2008

(54) TIME DELAY COMPENSATION CIRCUIT COMPRISING DELAY CELLS HAVING VARIOUS UNIT TIME DELAYS

(75) Inventors: Geun-Hee Cho, Suwon (KR); Byung-Hoon Jeong, Suwon (KR); Kyu-Hyoun Kim, Suwon (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 0 days.

(21) Appl. No.: 10/716,146

(22) Filed: Nov. 18, 2003

(65) Prior Publication Data

US 2004/0108877 A1    Jun. 10, 2004

(30) Foreign Application Priority Data

Dec. 10, 2002    (KR) ...................... 10-2002-0078392

(51) Int. Cl.
*H03L 7/06*    (2006.01)
(52) U.S. Cl. ...................... 327/158; 327/161; 327/276; 327/277; 327/284
(58) Field of Classification Search ........ 327/147–149, 327/156–159, 161, 266, 270, 271, 274, 277, 327/280, 284, 287; 375/376; 331/DIG. 2, 331/16–17, 1 A
See application file for complete search history.

(56) References Cited

U.S. PATENT DOCUMENTS

| | | | |
|---|---|---|---|
| 5,306,971 A * | 4/1994 | McCune | 327/270 |
| 6,292,040 B1 * | 9/2001 | Iwamoto et al. | 327/158 |
| 6,489,823 B2 * | 12/2002 | Iwamoto | 327/158 |
| 6,518,812 B1 * | 2/2003 | Sikkink et al. | 327/284 |
| 6,850,106 B1 * | 2/2005 | Kunanayagam et al. | 327/266 |
| 7,009,434 B2 * | 3/2006 | Lee | 327/158 |
| 7,157,951 B1 * | 1/2007 | Morrison et al. | 327/263 |

FOREIGN PATENT DOCUMENTS

KR    010064117    7/2001

\* cited by examiner

*Primary Examiner*—N. Drew Richards
*Assistant Examiner*—An T. Luu
(74) *Attorney, Agent, or Firm*—F. Chau & Associates, LLC

(57) ABSTRACT

A delay-locked loop includes a phase detector, a delay line, and a filter unit. The phase detector compares the phase of the external clock signal with that of the feedback clock signal and outputs a phase difference as an error control signal. The delay line includes delay cells having various unit time delays. The number of delay cells is adjusted in response to a shift signal. The delay line receives the external clock signal and outputs an output clock signal. The filter unit generates the shift signal in response to the error control signal. In the delay-locked loop, the front delay cells, which compensate for a delay of an external clock signal having a high frequency, have short unit time delays. The rear delay cells, which compensate for a delay of the external clock signal having a low frequency, have long unit time delays.

5 Claims, 7 Drawing Sheets

(tD1<tD2<tD3)

TIME DELAY COMPENSATION CIRCUIT COMPRISING DELAY CELLS HAVING VARIOUS UNIT TIME DELAYS

This application claims the priority of Korean Patent Application No. 2002-78392, filed on Dec. 10, 2002, in the Korean Intellectual Property Office.

BACKGROUND OF THE INVENTION

1. Technical Field

The present invention relates to time delay compensation circuits, and more particularly, to a time delay compensation circuit comprising delay cells having various unit time delays.

2. Discussion of the Related Art

In an I/O interface where data is transmitted in synchronization with a clock signal, as the load on a data bus is increased and the frequency of the clock signal becomes higher, it becomes more difficult to correctly synchronize the clock signal with the data. That is, the data needs to be correctly synchronized with an edge or the center of the clock signal.

A time delay compensation circuit is typically employed to achieve synchronization. Examples of time delay compensation circuits include a phase-locked loop and a delay-locked loop, which are closed loops, and a synchronous mirror delay (SMD), which is an open loop.

While the phase-locked loop and the delay-locked loop are both accurate, they need a locking time of 100 cycles or more to complete synchronization. Conversely, while SMD is not as accurate as the phase-locked loop or the delay-locked loop, synchronization can be completed with a locking time of only 2 cycles.

FIG. 1 is a block diagram of a typical delay-locked loop.

A delay compensation method of the typical delay locked-loop 100 will be described now. A phase detector 120 detects a phase difference between an external clock signal EXCLK and a feedback clock signal FEDCLK and generates an error control signal ERRS corresponding to the phase difference.

A filter unit 130 increases or decreases the number of delay cells operating in a delay line 110, which includes several delay cells (not shown), in response to the error control signal ERRS. The delay line 110 delays the external clock signal EXCLK by a certain time and outputs the external clock signal EXCLK as an output clock signal OCLK. The output clock signal OCLK is transmitted as a feedback clock signal FEDCLK to the phase detector 120.

The delay line 110 includes a plurality of delay cells each having a fixed unit time delay. When a long time delay is needed, many delay cells are selected from the delay line 110, and when a short time delay is needed, relatively few delay cells are selected.

The number of delay cells selected to operate in the delay line 110 is closely related to the frequency of the external clock signal EXCLK. When the frequency of the external clock signal EXCLK is great, a long time delay is needed. Thus, many delay cells are used. However, when the frequency of the external clock signal EXCLK is small, a few delay cells are used.

FIG. 2 is a block diagram of a typical synchronous mirror delay (SMD).

Referring to FIG. 2, the typical SMD 200 comprises a buffer 210 that receives an external clock signal EXCLK, a delay monitor circuit 220, a forward delay array 230 that delays the external clock signal EXCLK forward, a mirror control circuit 240, a backward delay array 250 that delays an output of the mirror control circuit 240 backward, and a clock driver 260.

The forward delay array 230 delays the external clock signal EXCLK forward from a predetermined edge of the external clock signal EXCLK to the next edge using the delay cells. The backward delay array 250 delays the external clock signal EXCLK backward from a predetermined edge of the external clock signal EXCLK to a previous edge using the delay cells. Thus, the synchronization is completed in only two cycles.

FIG. 3 illustrates delay cells in the delay line 110 shown in FIG. 1 and in the forward delay array 230 and the backward delay array 250 shown in FIG. 2.

As illustrated in FIG. 3, the delay line of the typical delay-locked loop, or the forward delay array or the backward delay array of the typical SMD, includes serially connected delay cells having an identical unit time delay tD.

When a cycle of the external clock signal EXCLK is tCK, tCK/tD delay cells are needed to compensate for the phase difference between the external clock signal EXCLK and the output clock signal OCLK.

The time delay compensation circuit, such as the delay-locked loop 100 shown in FIG. 1, or the synchronous mirror delay 200 shown in FIG. 2, causes the following problem. To obtain synchronization with an external clock signal having a low frequency, a large number of delay cells, connected in series, may be needed. However, the delay-locked loop or the synchronous mirror delay can only obtain synchronization with an external clock signal within a limited frequency range due to layout restrictions.

Consequently, if a single delay cell is designed to have a long unit time delay, when an external clock signal with a low frequency is input, the time delay compensation circuit can operate normally. However, serious jitter may be caused due to quantization error after the synchronization because synchronization using delay cells having a long unit time delay is less precise than synchronization using delay cells having a short unit time delay.

Conversely, when a single delay cell has a short unit time delay, the jitter can be reduced. However, a comparatively large number of delay cells needs to be used in the time delay compensation circuit.

Therefore, a need exists for a time delay compensation circuit for synchronizing an external clock signal using relatively few delay cells as compared to a conventional time delay compensation circuit.

SUMMARY OF THE INVENTION

The present invention provides a time delay compensation circuit in which the time delays of delay cells gradually increase from the front end to the rear end of a delay line. Thus, when an external clock signal with a low frequency is input, the time delay compensation circuit can operate normally and the number of delay cells can be reduced.

In accordance with an embodiment of the present invention, there is provided a delay-locked loop that receives an external clock signal and synchronizes the phase of a feedback clock signal with that of the external clock signal. The delay-locked loop includes a phase detector, a delay line, and a filter unit.

The phase detector compares the phase of the external clock signal with that of the feedback clock signal and outputs a phase difference as an error control signal. The delay line comprises a plurality of delay cells having various unit time delays. The number of delay cells in operation is varied in accordance with a predetermined shift signal. The delay line receives the external clock signal and outputs an output clock signal, which is obtained by controlling the phase of the external clock signal.

The filter unit generates the shift signal, which selects the number of delay cells in the delay line, in response to the error control signal.

In the delay line, the unit time delay gradually increases from the delay cell of the front end of the delay line to the delay cell of the rear end of the delay line. Each of the delay cells has a structure of a differential amplifier. In each differential amplifier, a resistance connected to a power supply voltage is adjusted to vary the unit time delay.

The resistances of the delay cells gradually increase from the delay cell of the front end to the delay cell of the rear end. In each differential amplifier, an input transistor, to which the external clock signal is transmitted, has a size that gradually increases from the delay cell of the front end to the delay cell of the rear end.

The differential amplifier includes a capacitor at an output end, and the capacitance of the capacitor gradually increases from the delay cell of the front end to the delay cell of the rear end.

In accordance with another embodiment of the present invention, there is provided a synchronous mirror delay (SMD) that includes a forward delay array (FDA), a mirror control circuit (MCC), and a backward delay array (BDA).

The FDA, which comprises a plurality of delay cells having various unit time delays, receives an external clock signal and generates a forward delay clock signal, which is obtained by forward delaying the phase of the external clock signal.

The MCC delays and outputs the forward delay clock signal in response to the forward delay clock signal and the external clock signal.

The BDA, which comprises a plurality of serially connected delay cells having various unit time delays, receives an output of the MCC and generates a backward delay clock signal, which is obtained by backward delaying the phase of the output of the MCC.

In the FDA and the BDA, the unit time delay of each delay cell is gradually increased from the delay cell of the front end of the array to the delay cell of the rear end of the array, wherein the array is at least one of the FDA and the BDA.

In each delay cell, a NAND gate and an inverter are connected in series. The unit time delay is varied by adjusting the sizes of transistors of the NAND gate and the inverter.

The sizes of the transistors gradually increase from the delay cell of the front end to the delay cell of the rear end. Each of the delay cells includes a capacitor at an output end, and the capacitances of the capacitors gradually increase from the delay cell of the front end to the delay cell of the rear end.

In the FDA and the BDA, the even-numbered delay cells have longer unit time delays than the odd-numbered delay cells. Alternatively, the odd-numbered delay cells have longer unit time delays than the even-numbered delay cells.

In accordance with still another embodiment of the present invention, there is provided a time delay compensation circuit that synchronizes an output clock signal with an external clock signal. The time delay compensation circuit comprises a delay unit and a control unit.

The delay unit, which comprises a plurality of delay cells having various unit time delays, receives the external clock signal and generates the output clock signal in synchronization with the external clock signal.

The control unit selects the number of delay cells in the delay unit and controls the number of delay cells such that the output clock signal is synchronized with the external clock signal.

In the delay unit, the unit time delays of the delay cells gradually increase from the delay cell of the front end to the delay cell of the rear end. In the delay unit, the even-numbered delay cells have longer unit time delays than the odd-numbered delay cells. Alternatively, the odd-numbered delay cells have longer unit time delays than the even-numbered delay cells.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF PREFERRED EMBODIMENTS

Figure 1:
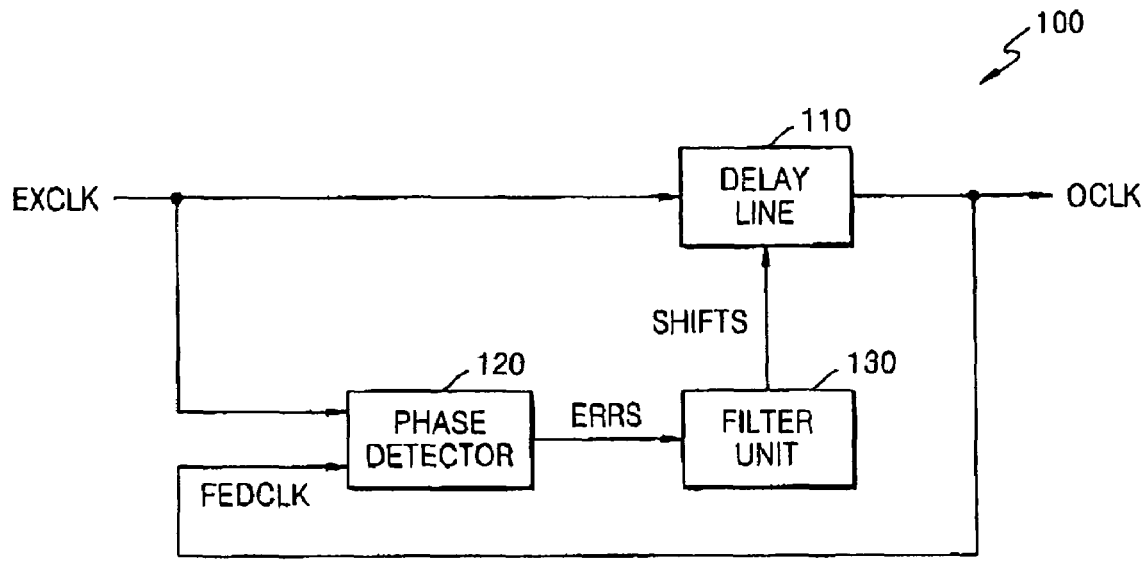
FIG. 1 is a block diagram of a typical delay-locked loop.

The present invention will now be described more fully with reference to the accompanying drawings, in which preferred embodiments of the invention are shown. The same reference numerals in different drawings represent the same element.

Figure 4:
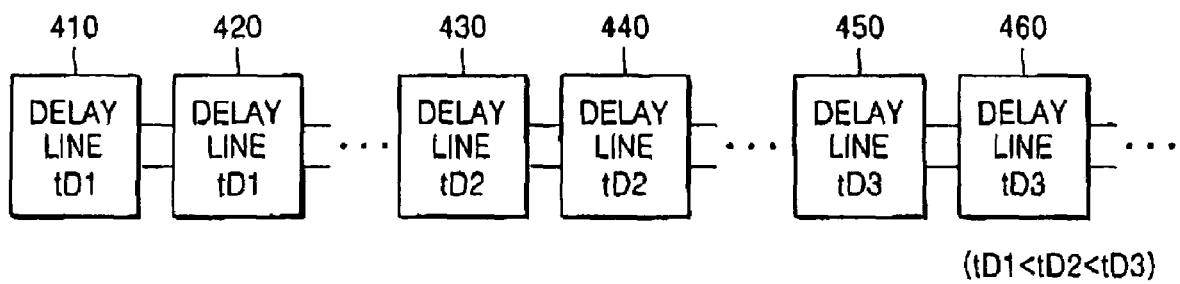
FIG. 4 illustrates delay cells having various unit time delays according to the present invention.

FIG. 4 illustrates delay cells having various unit time delays according to an embodiment of the present invention.

A delay-locked loop according to an embodiment of the present invention is substantially identical to a conventional delay-locked loop except that a delay line comprises delay cells 410 through 460 having various unit time delays. Accordingly, the structure and operation of the delay line will be described hereinafter.

The delay line 110 of the conventional delay-locked loop 100 includes a plurality of delay cells having the same unit time delay. The delay line of the delay-locked loop of the present invention comprises a plurality of delay cells 410 through 460 having various unit time delays tD1, tD2, and tD3.

The unit time delays of the delay cells gradually increase from the delay cell of the front end of the delay line to the delay cell of the rear end of the delay line. That is, the front delay cell 410 is used to compensate for a delay of an external clock signal having a high frequency (a short period), and therefore the front delay cell 410 has the shortest unit time delay of the delay cells of the delay line.

Conversely, the rear delay cell 460 is used to compensate for a delay of an external clock signal having a low frequency (a long period), and therefore the rear delay cell 460 has the longest unit time delay of the delay cells of the delay line.

The delay compensation of the external clock signal having a low frequency employs both the front delay cells having short unit time delays and the back delay cells having long unit time delays.

As a result of using the foregoing structure, the delay line of the delay-locked loop according to the present invention needs fewer delay cells to compensate for a delay of an external clock signal having a long period than the conventional delay-locked loop.

A phase detector compares the phase of an external clock signal with that of a feedback clock signal and outputs a phase difference as an error control signal. A filter unit generates a shift signal, which selects the number of delay cells in the delay line, in response to the error control signal.

The filter unit may comprise an electric charge pump and a filter. The electric charge pump can vary an electric charge generated in response to the error control signal, which comprises information about the phase difference between the external clock signal and the feedback clock signal. The varied electric charge is transmitted to the filter in the filter unit. Thus, the filter generates the shift signal.

The delay line adjusts the number of the delay cells in operation in response to the shift signal. The delay line receives the external clock signal and generates an output clock signal, which is obtained by controlling the phase of the external clock signal. The output clock signal is also used as a feedback clock signal to the phase detector.

Figure 5:
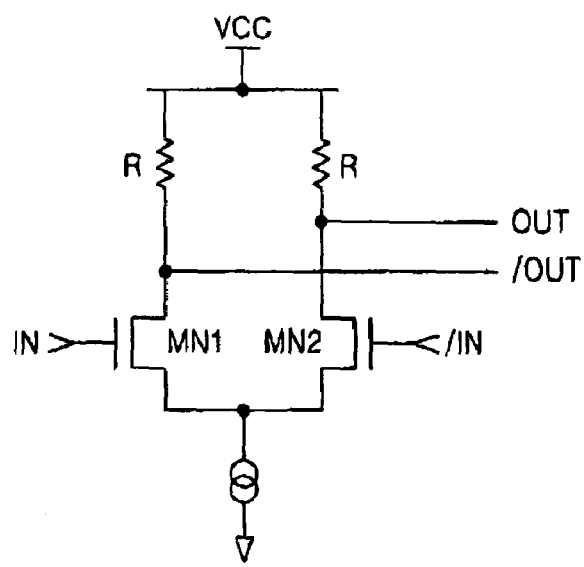
FIG. 5 is a circuit diagram of a delay cell of FIG. 4.

FIG. 5 is a circuit diagram of a delay cell of FIG. 4.

Referring to FIG. 5, the delay cell has a structure of a differential amplifier. However, it would be apparent to those of ordinary skill in the art that the delay cell could have other structures.

In the delay cell having the structure of the differential amplifier shown in FIG. 5, a resistance (R) connected to a power supply voltage VCC is adjusted to vary a unit time delay.

If the resistance connected to the power supply voltage is increased, the unit time delay becomes longer. Accordingly, as the resistance connected to the power supply voltage is gradually increased from the delay cell at the front end of the delay line to the delay cell at the rear end of the delay line, a unit time delay also becomes increasingly longer.

Figure 6:
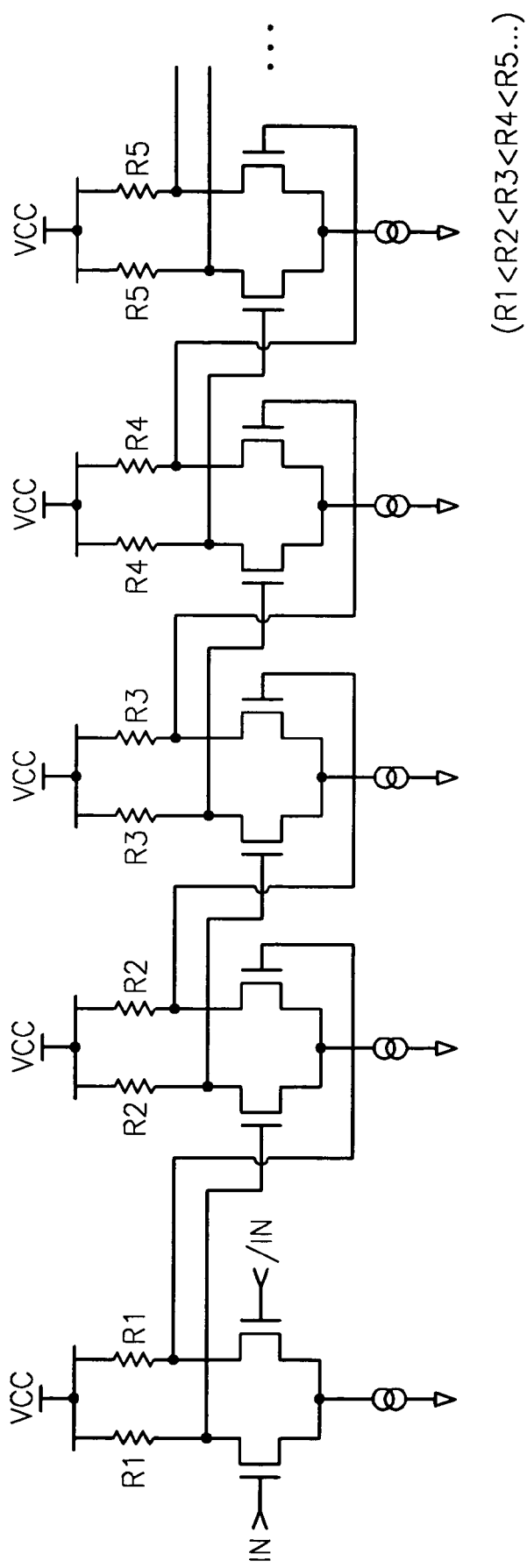
FIG. 6 illustrates an example of connection of the delay cells having the structure of FIG. 5.

FIG. 6 illustrates the delay line comprising delay cells arranged such that the resistance gradually increases from the delay cell at the front end of the delay line to the delay cell at the rear end of the delay line.

Figure 7:
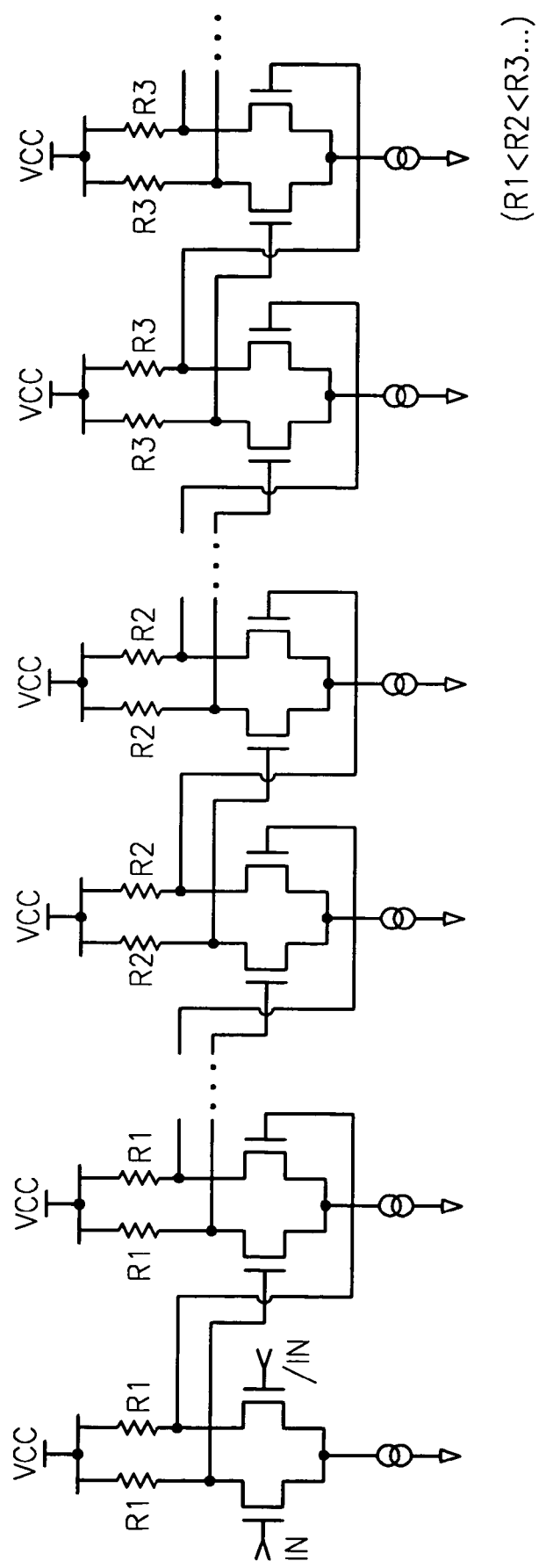
FIG. 7 illustrates another example of connection of the delay cells having the structure of FIG. 5.

FIG. 7 illustrates another example of the delay line comprising delay cells having the structure of FIG. 5.

As illustrated in FIG. 7, every two delay cells have substantially the same unit time delay. Also, the unit time delays of the delay cells gradually increase from the front end of the delay line to the rear end of the delay line. It will be understood by those of ordinary skill in the art that any structure in which unit time delays of the delay line gradually increase from the front end to the rear end may be made therein without departing form the scope of the present invention.

That is, a structure in which three or more delay cells comprise one block wherein unit time delays of the blocks gradually increase from the block at the front end of the delay line to the block at the rear end of the delay line also may be made without departing from the scope of the present invention.

According to another embodiment of the present invention, the size of a transistor in a delay cell is adjusted to vary the unit time delay of the delay cell. That is, the unit time delay of the delay cell is controlled by adjusting the sizes of input transistors MN1 and MN2 in the differential amplifier shown in FIG. 5.

In general, when the size of the transistor MN1 or MN2 is increased, the unit time delay is also increased. Accordingly, a delay line comprising delay cells having various unit time delays can be embodied by increasing the size of the input transistor MN1 or MN2 from the delay cell at the front end on the delay line to the delay cell at the rear end of the delay line.

In still another embodiment of the present invention, a capacitor is installed at an output end of the differential amplifier and the capacitance of the capacitor is adjusted to control the unit time delay. The capacitors can be installed at output ends OUT and /OUT of the differential amplifier shown in FIG. 5. The unit time delay can be extended by increasing the capacitances of the capacitors.

Accordingly, a delay line comprising delay cells having various unit time delays can be embodied by increasing a capacitance of the transistor installed at the output end of the differential amplifier from the delay cell at the front end of the delay line to the delay cell at the rear end of the delay line.

Figure 8:
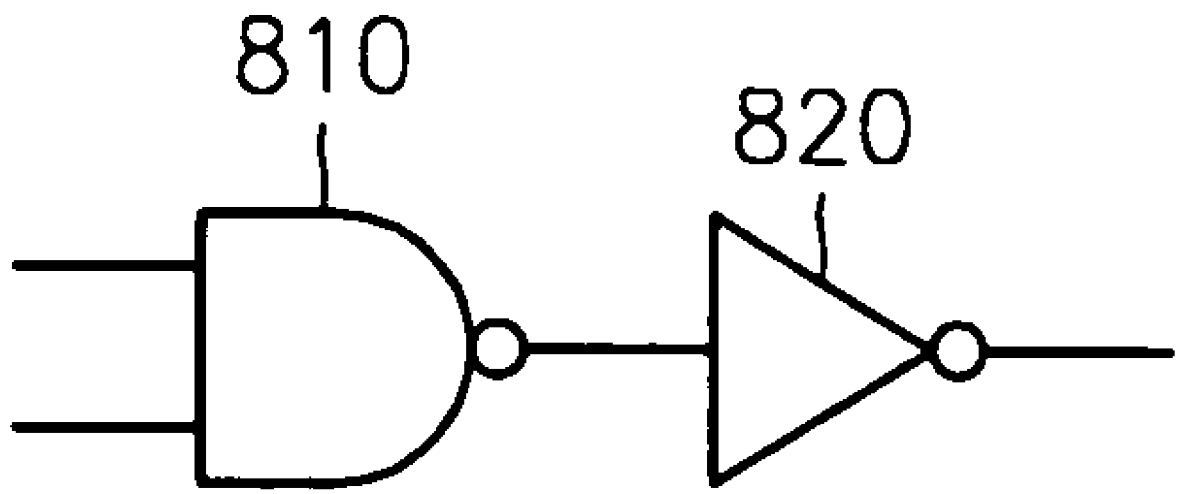
FIG. 8 illustrates a structure of a delay cell of a synchronous mirror delay.

FIG. 8 illustrates a structure of a delay cell of a synchronous mirror delay (SMD).

Figure 2:
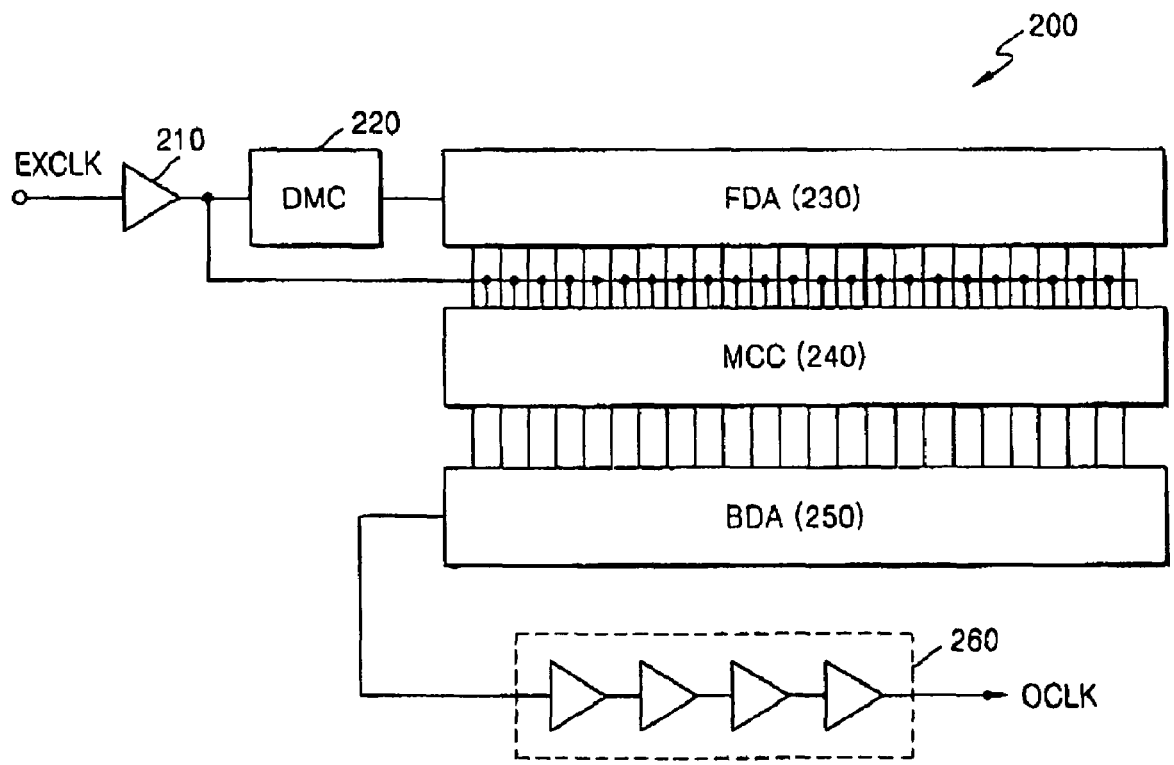
FIG. 2 is a block diagram of a typical synchronous mirror delay (SMD)
Figure 3:
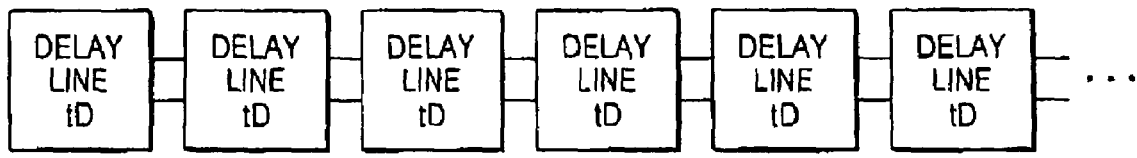
FIG. 3 illustrates delay cells in a delay line of FIG. 1 and in a forward delay unit and a backward delay unit of FIG. 2.

In the SMD 200 shown in FIG. 2, a forward delay array (FDA) 230 or a backward delay array (BDA) 250 includes delay cells. According to an embodiment of the present invention, in each array a NAND gate 810 and an inverter 820 are connected in series as illustrated in FIG. 8.

The SMD 200 according to an embodiment of the present invention is substantially identical to a typical SMD except that the SMD of the present invention comprises delay cells having various unit time delays. Accordingly, the structure and operation of the FDA and the BDA will be mainly described hereinafter.

The FDA 230 and the BDA 250 of the conventional SMD 200 each include a plurality of delay cells having an identical unit time delay. However, according to an embodiment of the present invention, the FDA and the BDA of the SMD each comprise a plurality of delay cells having various unit time delays.

In the FDA and the BDA, the unit time delays of the delay cells gradually increase from the delay cell at the front end of each array to the delay cell at the rear end of each array. That is, the front delay cell is used to compensate for a delay of an external clock signal having a high frequency (a short period), and the unit time delay of the front delay cell is relatively short as compared to other delay cells of the array.

Conversely, the rear delay cell is used to compensate for a delay of the external clock signal having a low frequency (a long period), and the unit time delay of the rear delay cell is relatively long as compared to other delay cells of the array.

The delay compensation of the external clock signal having a low frequency employs both the front delay cells having short unit time delays and the back delay cells having long unit time delays.

As a result of using the foregoing structure, the FDA and BDA of the SMD according to the present invention need fewer delay cells to compensate for a delay of an external clock signal having a long period than the conventional FDA and BDA of the SMD.

According to an embodiment of the present invention, in each delay cell, a NAND gate 810 and an inverter 820 are connected in series as illustrated in FIG. 8. The unit time delay is varied by adjusting the sizes of transistors (not shown) in the NAND gate 810 and in the inverter 820.

That is, the sizes of the transistors (not shown) of the NAND gate 810 and the inverter 820 become greater from the delay cell at the front end of the array to the delay cell at the rear end of the array. As the size of the transistor becomes greater, the unit time delay is increased. Since the method of using the size of the transistor (not shown) to control a unit time delay was described above, it will be omitted here.

According to an embodiment of the present invention, a capacitor is installed at an output end of the delay cell and the capacitance of the capacitor is adjusted to vary the unit time delay of the FDA and the BDA.

The capacitor is installed at the output end of the NAND gate 810 or the output end of the inverter 820, and the capacitance of the capacitor is increased from the delay cell at the front end of the array to the delay cell at the rear end of the delay. As the capacitance becomes greater, the unit time delay is increased.

A detailed description of an SMD according to an embodiment of the present invention will be described here with reference to FIG. 9.

The FDA comprises delay cells FUD1, FUD2, FUD3, and FUD4. Unit time delays tD1, tD2, tD3, and tD4 of the delay cells FUD1, FUD2, FUD3, and FUD4, respectively, gradually increase.

The BDA has the same structure as the FDA. That is, the BDA comprises delay cells BUD1, BUD2, BUD3, and BUD4, and the unit time delays tD1, tD2, tD3, and tD4 of the delay cells BUD1, BUD2, BUD3, and BUD4, respectively, gradually increase.

The MCC comprises NAND gates 915, 920, 925, and 930, which connect the FDA and the BDA.

Figure 9:
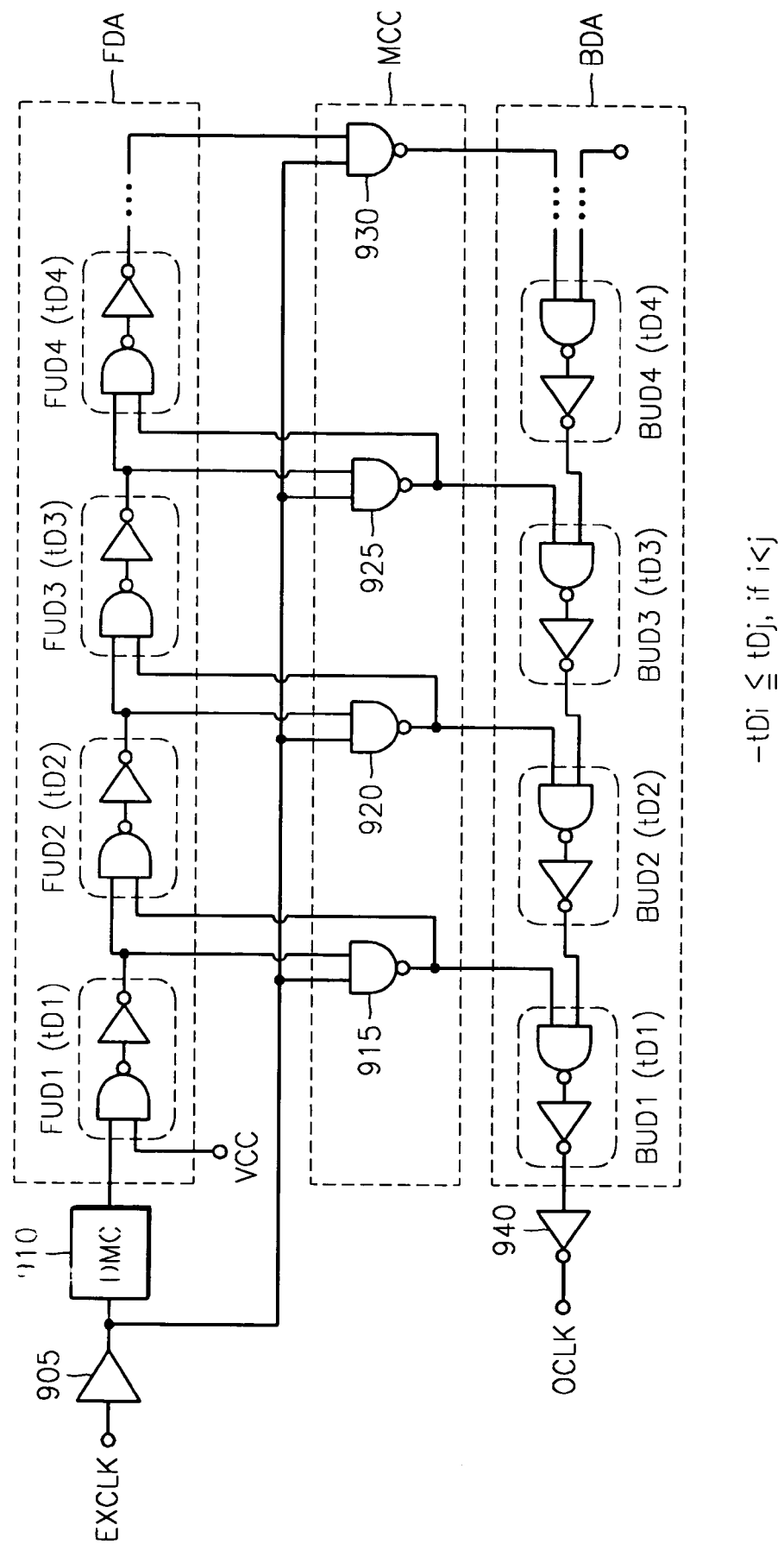
FIG. 9 illustrates a structure of a synchronous mirror delay according to the present invention.

By using the structure shown in FIG. 9, an external clock signal EXCLK having a long period can be synchronized with an output clock signal OCLK using fewer pairs of delay cells FUD1, FUD2, FUD3, FUD4, BUD1, BUD2, BUD3, and BUD4 than needed by a conventional SMD.

Figure 10:
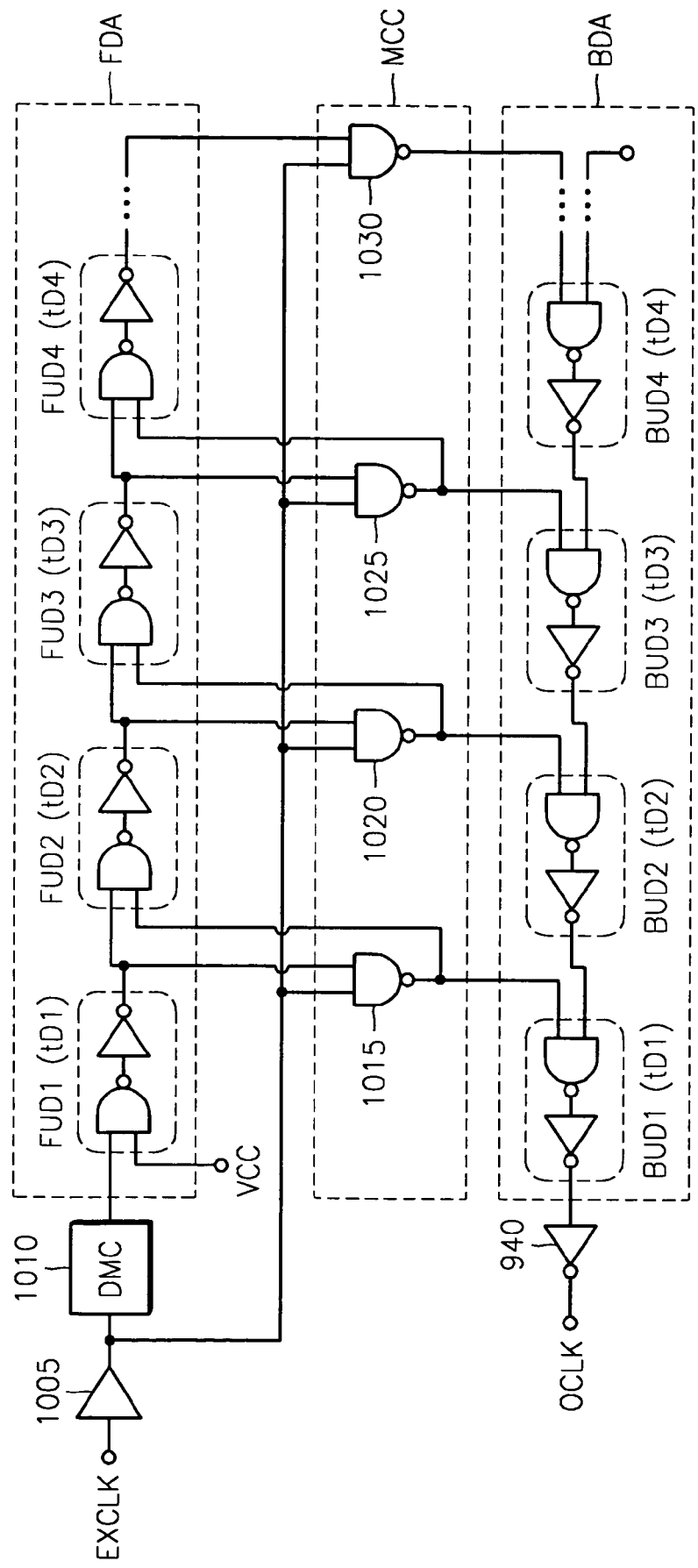
FIG. 10 illustrates another structure of the synchronous mirror delay according to the present invention.

FIG. 10 illustrates another structure of the SMD according to an embodiment of the present invention.

Referring to FIG. 10, in the FDA and the BDA, the even-numbered delay cells FUD2, FUD4, BUD2, and BUD4 have longer unit time delays than the odd-numbered delay cells FUD1, FUD3, BUD1, and BUD3. Alternatively, the odd-numbered delay cells FUD1, FUD3, BUD1, and BUD3 have longer unit time delays than the even-numbered delay cells FUD2, FUD4, BUD2, and BUD4.

Although the unit time delay is not increased from the front end to the rear end of the array, if the odd-numbered delay cells have different unit time delays from the even-numbered delay cells, a delay of the external clock signal EXCLK can be compensated using fewer delay cells than needed by a conventional SMD.

A time delay compensation circuit for synchronizing an output clock signal to an external clock signal according to still another embodiment of the present invention comprises a delay unit and a control unit.

The delay unit, which comprises a plurality of delay cells having various unit time delays, receives the external clock signal and generates the output clock signal in synchronization with the external clock signal.

More specifically, in the delay unit, the unit time delay is gradually increased from the delay cell at the front end of the delay unit to the delay cell at the rear end of the delay unit.

The delay unit according to an embodiment of the present invention performs substantially the same function as the delay line comprising the plurality of delay cells of a delay-locked loop of the present invention and an FDA and BDA comprising the plurality of delay cells of the present invention. Accordingly, a detailed description of the operation of the delay unit will be omitted here for brevity.

In the delay unit, the even-numbered delay cells may have longer unit time delays than the odd-numbered delay cells. Alternatively, the odd-numbered delay cells may have longer unit time delays than the even-numbered delay cells.

Here, the delay unit performs substantially the same function as the FDA or the BDA as described and shown in FIG. 10.

The control unit selects the number of delay cells of the delay unit and controls the number of delay cells such that the output clock signal is synchronized with the external clock signal. The control unit of the present invention performs the same function as the phase detector and filter unit in a delay-locked loop of the present invention.

Alternatively, the delay unit of the present invention may perform the same function as the delay monitor circuit, the mirror control circuit, and the clock driver in the SMD of the present invention.

As set forth above, in a time delay compensation circuit according to an embodiment of the present invention, the front delay cells, which are used to compensate for a delay of an external clock signal having a high frequency, have short unit time delays so as to reduce jitter due to a quantization error. Also, the rear delay cells, which are used to compensate for a delay of the external clock signal having a low frequency, have long unit time delays so as to reduce the number of delay cells needed for the delay compensation. Furthermore, as the number of delay cells decreases, the current consumption is lowered and the delay compensation time is shortened.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A delay-locked loop for receiving an external clock signal and synchronizing a phase of a feedback clock signal with a phase of the external clock signal, the delay-locked loop comprising:

a phase detector for comparing the phase of the external clock signal with the phase of the feedback clock signal and outputting a phase difference as an error control signal;

a delay line, comprising a plurality of delay blocks, each delay block comprising a plurality of delay cells having the same unit time delay, wherein the unit time delay of delay cells from different delay blocks are different, the delay line for receiving the external clock signal, controlling the phase of the external clock signal to obtain an output clock signal and outputting the output clock signal, wherein the number of delay cells in operation is adjusted in response to a shift signal, wherein each delay cell is a differential amplifier having a resistor connected to a power supply voltage, wherein the resistors of the delay cells from different delay blocks have different resistances and the resistors of the delay cells from the same delay block have the same resistance, to vary the unit time delay; and a filter unit for generating the shift signal for selecting the number of delay cells in operation in the delay line, in response to the error control signal.

2. The delay-locked loop of claim 1, wherein the delay line is structured such that a unit time delay gradually increases from the delay cell of a front end of the delay line to the delay cell of a rear end of the delay line.

3. The delay-locked loop of claim 1, wherein the resistance is gradually increased from the delay cell of a front end of the delay line to the delay cell of a rear end of the delay line.

4. The circuit of claim 1, wherein the delay cells of the delay line have gradually increasing unit time delays from the delay cells of a delay block at a front end of the delay line to the delay cells of a delay block at a rear end of the delay line.

5. The circuit of claim 1, wherein the resistance is gradually increased from the delay cells of a delay block of a front end of the delay line to the delay cells of a delay block of a rear end of the delay line.

* * * * *